United States Patent [19]

Roesner et al.

[11] Patent Number: 4,598,386
[45] Date of Patent: Jul. 1, 1986

[54] REDUCED-AREA, READ-ONLY MEMORY

[76] Inventors: Bruce B. Roesner, 18737 Lunada Point, San Diego, Calif. 92128; William L. Hays, 473 Coronado Hills Dr., San Marcos, Calif. 92069

[21] Appl. No.: 601,510

[22] Filed: Apr. 18, 1984

[51] Int. Cl.[4] .................. G11C 17/00; G11C 11/36
[52] U.S. Cl. ......................... 365/105; 365/189
[58] Field of Search ................ 365/105, 189, 230

[56] References Cited

U.S. PATENT DOCUMENTS 3,373,406  3/1968  Cannon et al. ............... 365/105
4,442,507  4/1984  Roesner ........................ 365/105

OTHER PUBLICATIONS

IBM Technical Disclosure Bulletin–vol. 22, No. 12, May 1980, pp. 5371 & 5372.

*Primary Examiner*—James W. Moffitt
*Attorney, Agent, or Firm*—Laurance E. Banghart

[57] ABSTRACT

A reduced-area, read-only memory, including a programmable read-only memory, accomplished with a first step of removing one word address line from the word decoder input and one bit address line from the bit decoder input. The number of decoder output lines is thus cut in half. Adjacent line-driving transistors are driven by the same decoder output line. The removed word decoder input, and its complement, drive auxiliary bit lines; the removed bit decoder input and its complement drive auxiliary word lines. Circuitry connected at crossovers of word lines with auxiliary bit lines and bit lines with auxiliary word lines selectively suppress the selection of one line of each pair of lines that is driven by a single decoder output. The invention is particularly effective when utilized with Schottky diodes insulated from the semiconductor substrate. In the memory cells the Schottky diodes can be connected in series with voltage-programmable resistors to provide a reduced-area, programmable, read-only memory.

10 Claims, 15 Drawing Figures

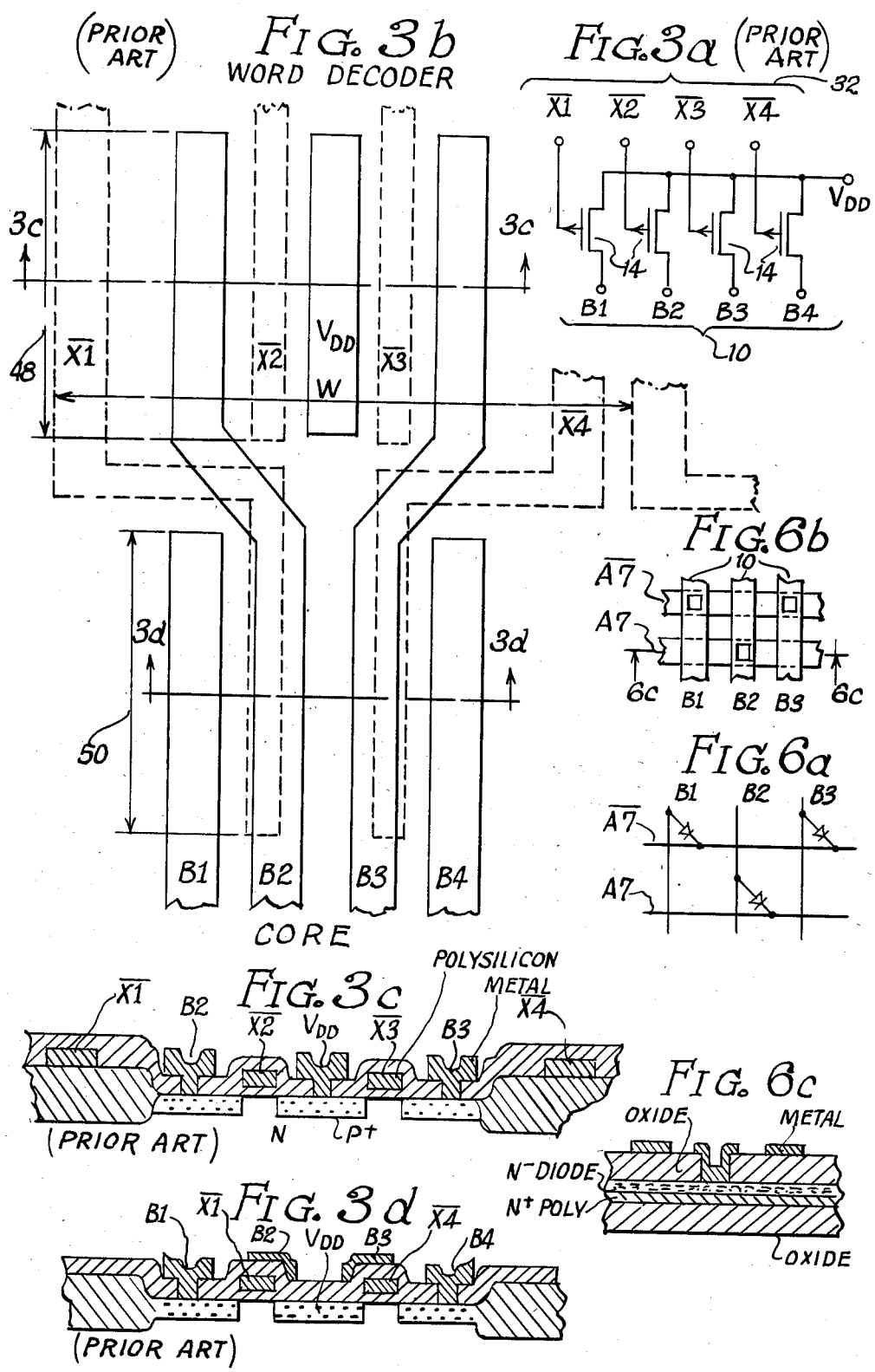

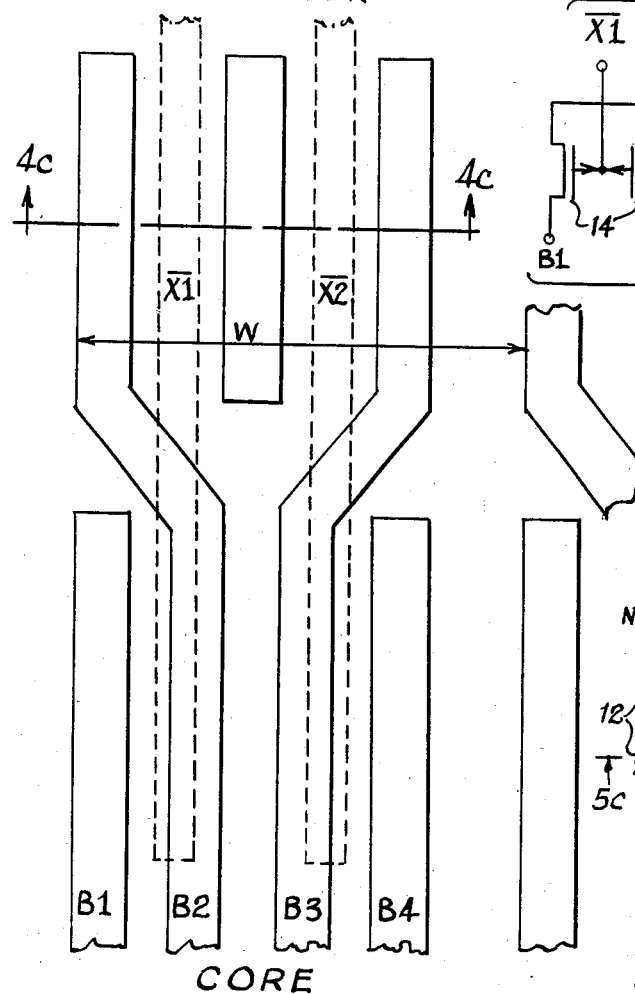
FIG. 4b WORD DECODER
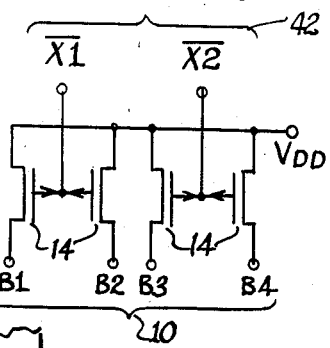
FIG. 4a
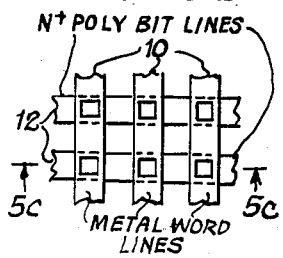
FIG. 5b
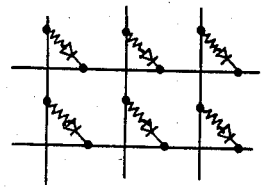
FIG. 5a
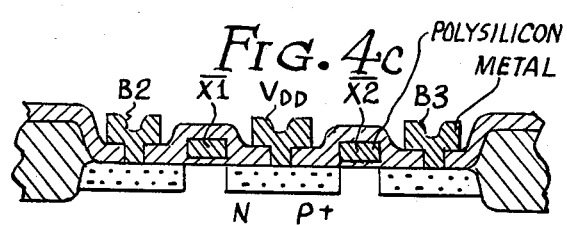
FIG. 4c
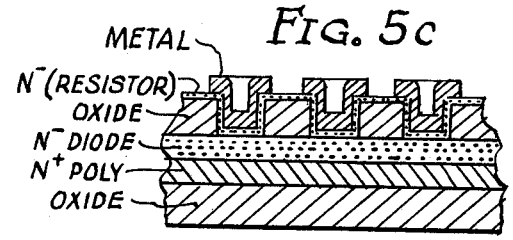
FIG. 5c

REDUCED-AREA, READ-ONLY MEMORY

BACKGROUND OF THE INVENTION

This invention relates generally to semiconductor devices and integrated circuits. More particularly it relates to the read-only memory (ROM), and the programmable, read-only memory (PROM). ROMs and PROMs store individual binary bits of information in what are termed cells. During functional operation, the binary information is read out of the cells; new information cannot be entered, and the information is nonvolatile in the sense that the information is not lost when power is removed.

The information content in a ROM is built in at the factory while the information content in a PROM is, in various ways, under the control of the user. The invention here pertains equally well to ROMs and PROMs, and the work ROM, used alone, will be considered to include both ROMs and PROMs.

A ROM comprises a plurality of parallel work lines, and a plurality of parallel bit lines. The bit lines are perpendicular to the work lines and the general area of eahc intersection of a word line and a bit line, along with any associated circuitry, constitutes a single memory cell. Normally the presence or absence of a conducting semiconductor device, diode or transistor, connecting the word line and the bit line determines the binary "1" or "0" state of the memory cell. The absence of a conducting semiconductor can result from (1) the absence of a complete transistor or diode, or (2) the presence of a high resistance in series with the semiconductor.

Reading out a memory cell requires that the appropriate word line, and the appropriate bit line be selected concurrently. Each word line and each bit line has a line-driving transistor. The transistors are driven by a work decoder and a bit decoder. The decoders have parallel, binary-address inputs, and have separate outputs for each possible binary input.

Many patents relating to ROMs have been issued. Bruce B. Roesner one of the applications here received U.S. Pat. No. 4,424,579, entitled Mask Programmable Read-Only Memory Stacked Above a Semiconductor Substrate. The exposition of the invention here calls upon the material of that invention in showing the area savings to be obtained using the teachings of this invention with the ROM of that invention.

The economic advantage in reducing the area of an integrated circuit, provided line widths and spacings are held constant at an optimum value, is very well known. A ROM is dominated in area by the area of the core which is the total area of all the memory cells.

Since each word line and bit line is driven by a line-driving transistor, the minimum spacing between lines in the memory cells is often determined by the widths of the line-driving transistor and its connecting lines. Since the line-driving transistors traverse both dimensions of the core, a reduction in line-driving transistor width and spacing prouces a squared reduction in core area. This invention relates specifically to reducing line-driving transistor width and spacing as no other known patent does.

SUMMARY OF THE INVENTION

A major object of this invention is to reduce ROM area with a first step of removing one word address line from the word decoder input and one bit address line from the bit decoder input. The number of decoder output lines is thus cut in half. Adjacent word line-driving transistors are driven by the same work decoder output line. Adjacent bit line-driving transistors are driven by the same bit decoder output line. The removed word decoder input, and its complement, drive auxiliary bit lines; the removed bit decoder input and its complement drive auxiliary word lines.

Circuitry means located at the crossover of each of the word lines and the appropriate auxiliary bit line, and connected between the lines, selectively suppress, according to the logical state of the auxiliary bit lines, the selection of one word line of each pair of word lines that is driven by a single word decoder output.

Similarly, circuitry means located at the crossover of each of the bit lines and the appropriate auxiliary word line, and connected between the lines, selectively suppress, according to the logical state of the auxiliary word lines, the selection of one bit line of each pair of bit lines that is driven by a single bit decoder output.

Another object of this invention is to utilize diodes as the circuitry means at the crossovers of work lines with auxiliary bit lines and bit lines with auxiliary word lines—in particular Schottky diodes insulated from the semiconductor substrate.

Another object of this invention is to utilize the same diodes in the memory cells as are utilized at the crossovers associated with the auxiliary lines.

Another object of this invention is to utilize voltage-programmable resistors in series with Schottky diode in the memory cells, along with the same Schottky diodes without the resistor at the crossovers associated with the auxiliary lines. This produces a programmable, read-only memory according to this invention with a dramatically reduced area.

BRIEF DESCRIPTION OF THE DRAWINGS

The invention will be better understood by reference to the following figures in which:

FIG. 3a is a schematic of four line-driving transistors of FIG. 1;

FIG. 3b is a plan view of the transistors of FIG. 3a as they appear on the semiconductor substrate;

FIG. 3c is an elevation section view of the transistors of FIGS. 3a and 3b, taken approximately along line 3c of FIG. 3b;

FIG. 3d is an elevation section view of the transistors of FIGS. 3a and 3b, taken approximately along line 3d of FIG. 3b;

FIG. 4a is a schematic of four line-driving transistors of FIG. 2;

FIG. 4b is a plan view of the transistors of FIG. 4a as they appear on the semiconductor substrate;

FIG. 4c is an elevation section view of the transistors of FIGS. 4a and 4b, taken approximately along line 4c of FIG. 4b;

FIG. 5a is a schematic of a small section of the core of FIG. 2;

FIG. 5b is a plan view of the core section of FIG. 5a as it appears on the semiconductor substrate;

FIG. 5c is an elevation section view of the core section of FIGS. 5a and 5b, taken approximately along line 5c of FIG. 5b;

FIG. 6a is a schematic showing diodes at the crossovers of several word lines and the auxiliary bit lines, both of FIG. 2;

FIG. 6b is a plan view of the crossovers and diodes of FIG. 6a as they appear on the semiconductor substrate; and FIG. 6c is an elevation section view of the crossovers and diodes of FIGS. 6a and 6b, taken approximately along line 6c of FIG. 6b.

DETAILED DESCRIPTION

Figure 1:
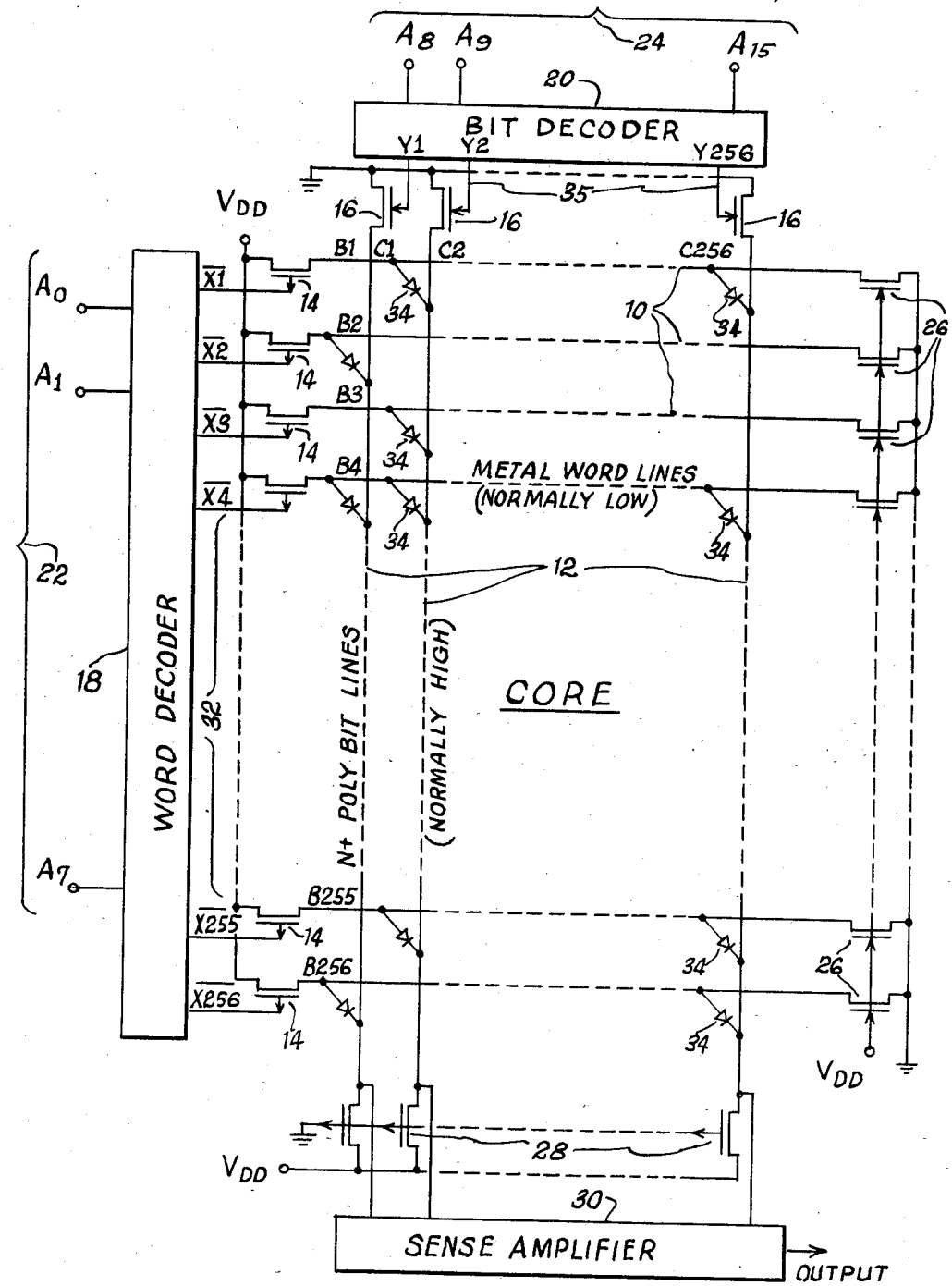
FIG. 1 is a part block diagram, part schematic, of a read-only memory of present art.

Referring now to FIG. 1, a present-art, read-only memory is shown for the express purpose of defining the invention here on the basis of changes from present art.

Input, word address lines 22 comprise lines $A_0$ and $A_7$. The word decoder 18 expands the eight address lines into 256 complementary output lines 32, only one of which will be at binary "zero" at any time. Input, bit address lines 24 comprise lines $A_8$ through $A_{15}$. The bit decoder 20 expands the eight address lines into 256 output lines 35, only one of which will be at binary "one" at any time.

The word decoder outputs 32 drive the word line-driving transistors 14 which in turn select the word lines 10 one at a time. The bit decoder outputs 35 drive the bit line-driving transistors 16 which is turn select the bit lines 12, one at a time.

The memory cells are located at the crossovers of each of the word lines 10 and each of the bit lines 12. With 256 word lines and 256 bit lines there are 65,536 memory cells in this example. Popularly this size is considered to have 64 thousand cells and is called a 64K ROM. The binary information state of a cell is determined by the presence or absence of a diode 34 connected between the bit and word lines associated with the cell.

The bit lines are connected to a sense amplifier 30 that interprets all-lines-at-a-high voltage as one binary information state, and any-line-at-a-low voltage as the other binary information state. For a bit line 12 to have a low voltage, the line must be selected by its bit line-driving transistor 16 and there must not be a diode at its crossover with the selected word line. When there is a diode present there, the selected word line keeps the bit line at a high voltage because the word line-driving transistors 14 have a considerably lower impedance than the bit line-driving transistors 16.

Figure 2:
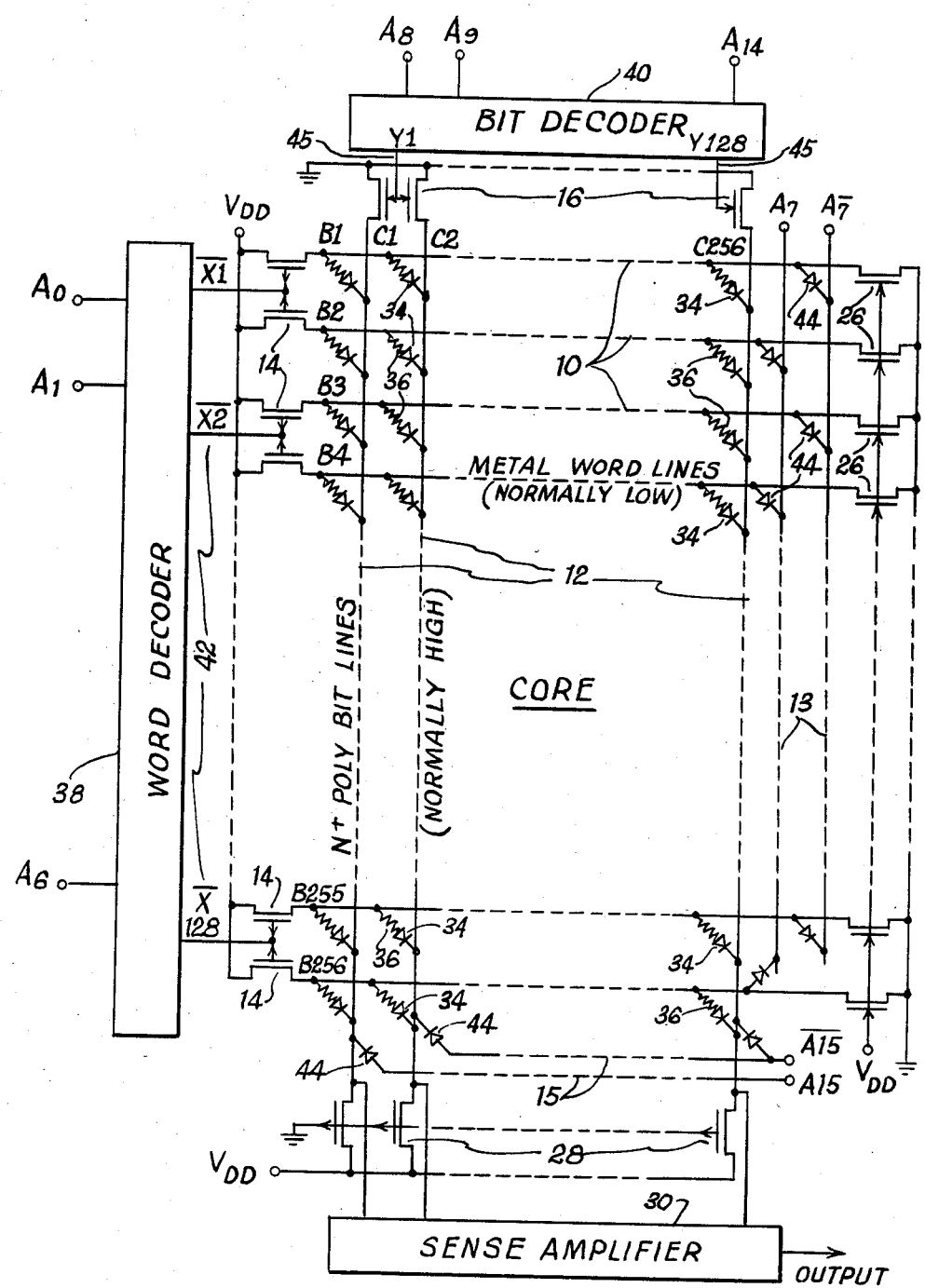
FIG. 2 is a part block diagram, part schematic, of a programmable, read-only memory in accordance with this invention.

Referring now to FIG. 2, a programmable, read-only memory of this invention is shown. Other than the programmability, as evidenced by voltage-programmable resistors 36, this circuit is interchangeable with the circuit of FIG. 1. The user cannot detect any difference between the circuits. As will be seen, the difference in the circuits is the difference in circuit area.

Input word address lines $A_0$ and $A_6$ are expanded in word decoder 38 into 128 complementary outut lines 42. Input word address line $A_7$ and its complement $\overline{A_7}$, instead of being inputs to the word decoder 38, drive auxiliary bit lines 13. Considering a typical pair of word lines, B1 and B2, driven from a single word decoder output $\overline{X1}$, line B1 is connected by diode 44 to $\overline{A_7}$, and line B2 is connected by diode 44 to $A_7$. These diodes 44 have a much lower impedance than word line-driving transistors 14. This assures that only one line of the pair B1, B2 can be selected at one time even though they both are associated with $\overline{X1}$. Conversely each one of the pair will be selected depending on the state of $A_7$.

Input bit address lines $A_8$ through $A_{14}$ are expanded in bit decoder 40 into 128 output lines 45. Input bit address line $\overline{A_{15}}$ and its complement $A_{15}$, instead of being inputs to the bit decoder 40, drive auxiliary word lines 15. Considering a typical pair of bit lines, C1 and C2, driven from a single bit decoder output Y1, line C1 is connected by diode 44 to $\overline{A_{15}}$, and line C2 is connected by diode 44 to $A_{15}$. These diodes 44 have a much lower impedance than bit line-driving transistors 16. This assures that only one line of the pair C1, C2 can be selected at one time even though they both are associated with Y1. Conversely each one of the pair will be selected depending on the state of $A_{15}$.

Referring now to FIGS. 3 a,b,c, four adjacent, word, line-driving transistors 14 of FIG. 1 (present art) are shown schematically in FIG. 3a. The transistors are shown in plan view on the semiconductor substrate in FIG. 3b. The width of transistors 14 associated with B2 and B3 is shown as 48. The width of transistors 14 associated with B1 and B4 is shown as 50. FIG. 3c and 3d are cross sections showing the complementary, metal-oxide-silicon (CMOS) process being used here as an example. The significant parameter here is shown as W, the width of four adjacent line-driving transistors along with the associated inputs.

The line widths and spacings of B1, B2, B3, and B4 are shown in desirable, minimum-width dimensions. However, these dimensions cannot be continued over the core. The width W is considerably greater than the width of B1, B2, B3, and B4, primarily due to the width and spacings of X1 and X4.

Referring now to FIGS. 4 a,b,c, four adjacent, word, line-driving transistors 14 of FIG. 2 (of this invention) are shown schematically in FIG. 4a. The transistors are shown in plan view on the semiconductor substrate in FIG. 4b. FIG. 4c is a cross section that is notably different than FIG. 3c due to the absence of the two inputs $\overline{X3}$ and $\overline{X4}$. There is no need for a FIG. 4d because it would be identical with FIG. 3d. FIGS. 4 a,b,c shows only word lines. The same procedure is used with bit lines, the only difference being that the lines going into the core are N+ polysilicon rather than metal.

The crucial W parameter of FIG. 4b is 72% of the W parameter of FIG. 3b. The area of the core of FIGS. 4 a,b,c will thus be 52% (0.72×0.72) of the area of the core of FIGS. 3 a,b,c—a truly significant reduction.

There is also an area reduction due to the reduced capacity of the word decoder, 38 of FIG. 2, and the bit decoder, 40 of FIG. 2. Conversely there is an increase in area due to the two auxiliary bit lines 13 and the two auxiliary word lines 15. These are insignificant changes compared with the area reduction in the core.

FIG. 5a is a schematic of a small section of the core of FIG. 2. Voltage-programmable resistors in series with Schottky diodes are connected between each metal word line and each N+ polysilicon bit line. One binary information state is programmed with higher than operational voltage applied across the resistor diode combination. This permanently reduces the resistance of the resistor to a very low value and the combination effectively becomes just a diode. When the high voltage is not applied, the resistance is so high as to make the combination effectively an open circuit which indicates the other binary information state.

FIG. 5b is a plan view of the core section of FIG. 5a as it appears on the semiconductor substrate. FIG. 5c is a cross section showing the core deposited on an insulation layer above the semiconductor substrate.

FIG. 6a shows a schematic at the crossovers of $\overline{A7}$ and A7 with typical work lines B1, B2, and B3, all of FIG. 2. FIG. 6b is a plan view of the crossovers of FIG. 6a as it appears on the semiconductor substrate. FIG. 6c is a cross section of the crossovers and diodes of FIGS. 6a and 6b. The diodes here are fabricated along with the diodes in FIG. 5 and are identical. However, there are no resistors fabricated in series with the diodes here, and the diodes are not fabricated at all where not wanted. FIGS. 6a,b,c would apply equally to crossovers of A15 and $\overline{A15}$ with C1 through C256, the only difference being that A15 and $\overline{A15}$ are metal lines and C1 and C256 are N+ polysilicon lines.

The preferred embodiment of FIGS. 2,4,5, and 6 shows a reduction in core area of 48% using a particular process and structure: silicon-gate, CMOS, with a core utilizing insulated Schottky diodes. It should not be inferred that such area savings can only be related to that process and structure. The innovations and novelty of this invention, as expressed in the claims, are not limited to any one process or structure, and a person skilled in the art can readily apply them with advantage to other processes and structures.

What I claim is:

1. A method for reducing the area of integrated-circuit, read-only memorys, including programmable read-only memorys, that have a plurality of parallel word lines, a plurality of parallel bit lines, the bit lines being perpendicular to the word lines, each bit and word line being selectable by its own line-driving transistor, the word line-driving transistors being driven by word address lines as expanded by a word decoder, and the bit line-driving transistors being driven by bit address lines as expanded by a bit decorder, the method comprising:
   a. removing one word address line from the word decoder input and one bit address line from the bit decoder input, reducing the total number of decoder outputs of one-half the normal number;
   b. connecting each word decoder output and each bit decoder output to two adjacent line-driving transistors;
   c. utilizing the removed word address line and its complement to drive two auxiliary bit lines;
   d. suppressing selectively, according to the logical state of the auxiliary bit lines, the selection of one word line of each pair of word lines that is driven from a single word decoder output, by locating circuitry means at the crossover of each of the word lines and the appropriate auxiliary bit line, connecting the lines through the circuitry means;
   e. utilizing the removed bit address line and its complement to drive two auxiliary word lines; and
   f. suppressing selectively, according to the logical state of the auxiliary word lines, the selection of one bit line of each pair of bit lines that is driven by a single bit decoder output, by locating circuitry means at the juncture of each of the bit lines and the appropriate auxiliary word line, connecting the lines through the circuitry means.

2. An improved integraged-circuit, read-only memory, including programmable read-only memory, having a plurality of parallel word lines, a plurality of parallel bit lines, the bit lines being perpendicular to the word lines, each bit and word line being selectable by its own line-driving transistor, the word line-driving transistors being driven by word address lines as expanded by a word decoder, and the bit line-driving transistors being driven by bit address lines as expanded by a bit decoder, wherein the improvement comprises;
   a. a word decoder driven by one less than all of the word address lines, each word decoder output driving two adjacent word line-driving transistors;
   b. two auxiliary bit lines driven by the true and complement of the word address line that is not driving the word decoder;
   c. circuitry means located at the crossover of each of the word lines and the appropriate auxiliary bit line, and connected between the lines to selectively suppress, according to the logical state of the auxiliary bit lines, the selection of one word line of each pair of word lines that is driven by a single word decoder output;
   d. a bit decoder driven by one less than all of the bit address lines, each bit decoder output driving two adjacent bit line-driving transistors;
   e. two auxiliary word lines driven by the true and complement of the bit address line that is not driving the bit decoder; and
   f. circuitry means located at the crossover of each of the bit lines and the appropriate auxiliary word line, and connected between the lines the selectively suppress, according to the logical state of the auxiliary word lines, the selection of one bit line of each pair of bit lines that is driven by a single bit decoder output.

3. A read-only memory according to claim 2 wherein said circuitry means is a diode.

4. A read-only memory according to claim 3 wherein said diode is a Schottky diode.

5. An integrated-circuit, read-only memory, including programmable read-only memory, fabricated in and on a semiconductor substrate, the memory comprising;
   a. a plurality of parallel word lines;
   b. a plurality of parallel bit lines, the bit lines being perpendicular to the word lines;
   c. memory cells located at the crossover of each word line and each bit line;
   d. a plurality of first circuitry means, each connected between the word line and the bit line of a memory cell indicating a binary information state, the cells without said semiconductor means indicating the other binary information state;
   e. a word line-driving transistor for selecting and driving each word line;
   f. input, word address lines;
   g. a word decoder driven by one less than all of the word address lines, each word decoder output driving two adjacent word line-driving transistors;
   h. two auxiliary bit lines driven by the true and complement of the word address line that is not driving the word decoder;
   i. a plurality of second circuitry means connected between every word line and its appropriate auxiliary bit line to selectively suppress, according to the logical state of the auxiliary bit lines, the selection of one word line of each pair of word lines that is driven by a single word decorder output;
   j. a bit line-driving transistor for selecting and driving each bit line;
   k. input, bit address lines;

l. a bit decoder driven by one less than all of the bit address lines, each bit decoder output driving two adjacent bit line-driving transistors;

m. two auxiliary word lines driven by the true and complement of th bit address line that is not driving the bit decoder; and n. a plurality of said second circuitry means connected between every bit line and its appropriate auxiliary word line to selectively suppress, according to the logical state of the auxiliary word lines, the selection of one bit line of each pair of bit lines that is driven by a single bit decoder output.

6. A read-only memory according to claim 5 wherein both said first and said second circuitry means are diodes.

7. A read-only memory according to claim 6 further comprising an insulating layer between the semiconductor substrate and said diodes.

8. A read-only memory according to claim 7 wherein said diodes are Schottky diodes.

9. A read-only memory according to claim 5 wherein said first circuitry means is a voltage-programmable resistor in series with a Schottky diode.

10. A read-only memory according to claim 9 wherein said second circuitry means is a Schottky diode.

* * * * *